US005132600A

United States Patent [19]

Kinoshita

[11] Patent Number: 5,132,600
[45] Date of Patent: Jul. 21, 1992

[54] LOAD DRIVING CIRCUIT HAVING A PAIR OF PUSH-PULL CIRCUITS

[75] Inventor: Hitoshi Kinoshita, Kawasaki, Japan

[73] Assignee: Kabushiki Kaisha Toshiba, Kawasaki, Japan

[21] Appl. No.: 704,306

[22] Filed: May 22, 1991

[30] Foreign Application Priority Data

May 25, 1990 [JP] Japan ................... 2-136700

[51] Int. Cl.$^5$ ................ H02P 1/22; H03K 17/66
[52] U.S. Cl. .................. 318/293; 318/280; 318/287
[58] Field of Search ............ 318/280, 287, 291, 293, 318/294

[56] References Cited

U.S. PATENT DOCUMENTS

| | | | |
|---|---|---|---|
| 4,275,340 | 6/1981 | Schleupen | 318/293 X |
| 4,336,562 | 6/1982 | Kotowski | 318/294 X |
| 4,447,768 | 5/1984 | Terui | 318/293 |
| 4,544,869 | 10/1985 | Pittaway | 318/293 |

Primary Examiner—Bentsu Ro
Attorney, Agent, or Firm—Finnegan, Henderson, Farabow, Garrett and Dunner

[57] ABSTRACT

A load driving circuit includes a pair of push-pull circuits formed of bipolar transistors. A load is connected between the output terminals of the push-pull circuits and the polarity of a current flowing in the load can be changed to drive the load. The pair of push-pull circuits are controlled by means of an output transistor driving circuit. The output transistor driving circuit includes first and second driving transistors for driving output transistors constituting the push-pull circuits and first and second control transistors for preventing the flow of a through current. The emitter and collector of the first control transistor are respectively connected to the emitter and base of the first driving transistor or the emitter and base of the output transistor arranged on the power source side and constituting one push-pull circuit. The emitter and collector of the second control transistor are respectively connected to the emitter and base of the second driving transistor or the emitter and base of the output transistor arranged on the power source side and constituting another push-pull circuit. The conduction states of the first and second driving transistors are controlled by signals set in an inverted phase. The conduction state of the first and second control transistors are respectively controlled by signals which is in the same phase as the signal for controlling the second and first driving transistors.

10 Claims, 3 Drawing Sheets

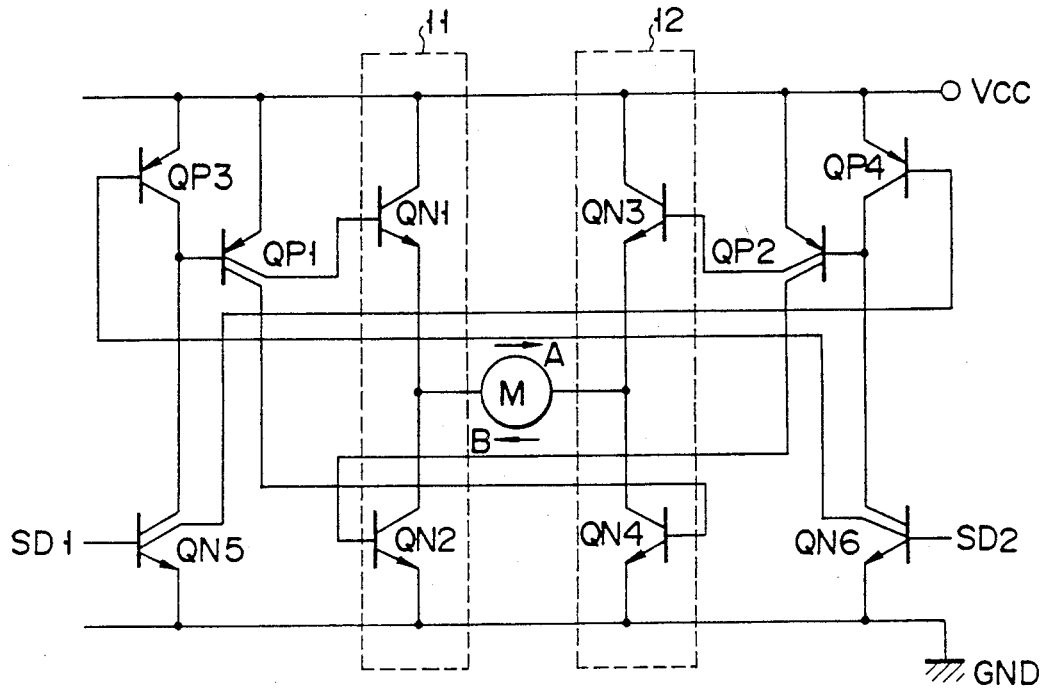
F I G. 2
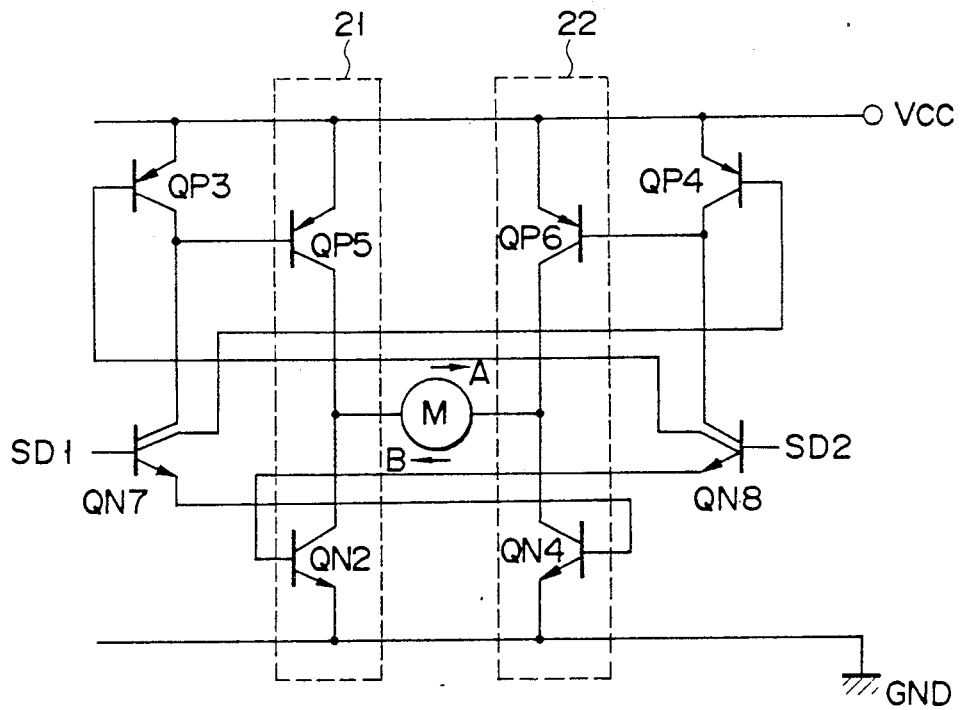
F I G. 3

LOAD DRIVING CIRCUIT HAVING A PAIR OF PUSH-PULL CIRCUITS

BACKGROUND OF THE INVENTION

1. Field of the Invention

This invention relates to a load driving circuit for driving a load such as a motor, and more particularly to a load driving circuit having a pair of push-pull circuits which are constituted by bipolar power transistors to deal with a peak current of 2 to 3 A or more and driving a load connected between the output terminals of the push-pull circuits.

2. Description of the Related Art

FIG. 1 shows a conventional motor driving circuit for driving a bi-directional motor. The circuit includes first and second push-pull circuits 11 and 12 and driving transistors QP1 and QP2 for driving the push-pull circuits 11 and 12. The first push-pull circuit 11 is constituted by NPN output (power) transistors QN1 and QN2 whose current paths are serially connected between a power source Vcc and a ground terminal GND. Likewise, the second push-pull circuit 12 is constituted by NPN output transistors QN3 and QN4 whose current paths are serially connected between the power source Vcc and the ground terminal GND. The driving transistors QP1 and QP2 are used to control the pair of push-pull circuits 11 and 12 so a to change the polarity of a current to be supplied to a bi-directional motor M and are each constituted by a PNP multi-collector (two-collector) transistor. The emitter of the transistor QP1 is connected to the power source Vcc and the first and second collectors thereof are respectively connected to the bases of the output transistors QN1 and QN4. The emitter of the transistor QP2 is connected to the power source Vcc and the first and second collectors thereof are respectively connected to the bases of the output transistors QN3 and QN2. The bases of the driving transistors QP1 and QP2 are respectively supplied with driving control signals SD1 and SD2 which are set in an inverted relationship. The bi-directional motor M connected between the output terminals of the pair of push-pull circuits 11 and 12 is rotated in a forward or reverse direction according to the levels of the driving control signals SD1 and SD2.

Next, the operation of the motor driving circuit shown in FIG. 1 is explained. When the driving control signal SD1 is set to a low level and the driving control signal SD2 is set to a high level, the transistors QP1 and QP2 are respectively turned on and off, the output transistors QN1 and QN2 of the push-pull circuit 11 are respectively turned on and off, and the output transistors QN3 and QN4 of the push-pull circuit 12 are respectively turned off and on. As a result, a current flows from the power source Vcc into the ground terminal GND via the collector-emitter path of the output transistor QN1, the motor M, and the collector-emitter path of the output transistor QN4. Therefore, a current flows in the motor M in a direction indicated by an arrow A, thereby rotating the motor M in a forward direction. On the other hand, when the driving control signal SD1 is set to a high level and the driving control signal SD2 is set to a low level, the transistors QP2 and QP1 are respectively turned on and off, the output transistors QN1 and QN2 of the push-pull circuit 11 are respectively turned off and on, and the output transistors QN3 and QN4 of the push-pull circuit 12 are respectively turned on and off. As a result, a current flows from the power source Vcc into the ground terminal GND via the collector-emitter path of the output transistor QN3, the motor M, and the collector-emitter path of the output transistor QN2. Therefore, a current flows in the motor M in a direction indicated by an arrow B, thereby rotating the motor M in a reverse direction.

Thus, the motor driving circuit shown in FIG. 1 may change the polarity of a current supplied to the motor M according to the levels of the driving control signals SD1 and SD2 supplied to the bases of the driving transistors QP1 and QP2, thereby making it possible to change the rotation direction of the motor M.

In a case where the levels of the driving control signals SD1 and SD2 are changed in order to change the rotation direction of the motor M, both of the output transistors QN1 and QN2 of the first push-pull circuit 11 or both of the output transistors QN3 and QN4 of the second push-pull circuit 12 may be set in the ON state at the same time if one of the driving transistors QP1 and QP2 is turned off with time delay when the other transistor is turned on. At this time, a large through current flows between the power source Vcc and the ground terminal GND, causing the transistor to be deteriorated or damaged. Particularly, when the driving transistors QP1 and QP2 are formed of a lateral PNP transistor, the transition time from the ON state to the OFF state is long, making the above problem more serious.

In order to prevent the through current, various types of circuits have been proposed in the prior art. As a typical example of the circuit, there is provided a circuit system which supplies the driving control signals SD1 and SD2 to a logic circuit to control the timing of inversion so that one of the driving transistors will not be turned on before the other driving transistor is turned off wherein and all of the output transistors QN1 to QN4 may be set in the OFF state for a preset period of time when the rotation direction of the motor M is changed. There is also known another circuit system in which a circuit having a time constant is connected to the bases of the output transistors QN2 and QN4 on the side of the ground terminal GND so as to prevent the output transistors constituting the push-pull circuit from being set in the ON state at the same time.

However, the logic circuit for preventing the flow of through current requires a large number of elements, increasing the chip size when the motor driving circuit is formed in an integrated circuit configuration. Further, when the impedance of the circuit for giving the time constant to the bases of the output transistors QN2 and QN4 on the side of the ground terminal GND is increased, the number of elements used becomes large, and when the impedance thereof is reduced, a correspondingly large capacitance is required, making it difficult to integrate the circuit and thereby increasing the number of parts to be externally attached.

SUMMARY OF THE INVENTION

Accordingly, an object of this invention is to provide a load driving circuit capable of preventing the flow of through current in a push-pull circuit when the polarity of a current flowing in the load is changed without significantly increasing the chip size and without increasing the number of parts externally attached.

The above object can be attained by a load driving circuit comprising a first push-pull circuit having first and second output transistors of NPN type whose current paths ar serially connected between a power source and a ground terminal and having an output terminal connected to one end of a load; a second push-pull circuit having third and fourth output transistors of NPN type whose current paths are serially connected between the power source and the ground terminal and having an output terminal connected to the other end of the load; a first driving transistor of multi-collector PNP type having an emitter connected to the power source, a first collector connected to the base of the first output transistor, and a second collector connected to the base of the fourth output transistor; a second driving transistor of multi-collector PNP type having an emitter connected to the power source, a first collector connected to the base of the third output transistor, and a second collector connected to the base of the second output transistor and driven in an inverted phase with respect to the first driving transistor; a first control transistor of PNP type having an emitter connected to the power source, a collector connected to the base of the first driving transistor and driven in the same phase as the second driving transistor; and a second control transistor of PNP type having an emitter connected to the power source, a collector connected to the base of the second driving transistor and driven in the same phase a the first driving transistor.

With the above construction, since the second or first control transistor of PNP type, which functions to prevent the flow of through current, and is connected between the emitter and base of the first or second driving transistor, which is changed from the OFF state to the ON state when the polarity of a current supplied to the load is changed, is controlled to be changed from the ON state to the OFF state, the inverting operation of changing the driving transistor from the OFF state to the ON state is delayed by the time delay caused in the operation of changing the control transistor from the ON state to the OFF state. Therefore, even when the inverting operation of changing the second or first driving transistor, which is changed from the ON state to the OFF state at the time of changeover of the polarity of the above current from the ON state to the OFF state is delayed, two output transistors of the first and second push-pull circuits are prevented from being set in the ON state at the same time. That is, time lag occurs when the polarity of the current to be supplied to the load is changed, and a through current is prevented from flowing in each push-pull circuit. Thus, the output transistors will not be deteriorated or damaged. Further, since only two control transistors are required to be additionally used, an increase in the size of the chip is small and externally attached parts are not necessary when the circuit is integrated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a load driving circuit according to a first embodiment of this invention;

FIG. 3 is a circuit diagram showing a load driving circuit according to a second embodiment of this invention;

DETAILED DESCRIPTION OF THE PREFERRED EMBODIMENTS

Figure 1:
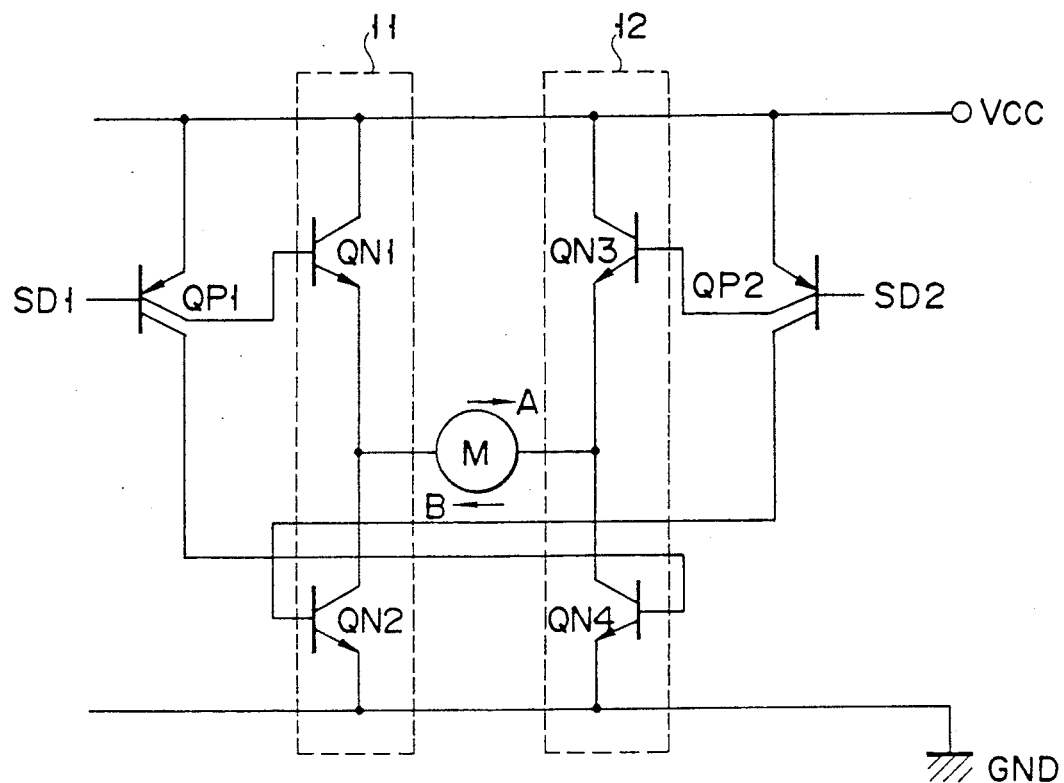
FIG. 1 is a circuit diagram showing a conventional load driving circuit.

FIG. 2 shows a load driving circuit according to a first embodiment of this invention. The circuit is a motor driving circuit for rotating a motor M in a forward or reverse direction by changing the polarity of current flowing in the motor M. The driving circuit includes first and second push-pull circuits 11 and 12 each formed of two bipolar power transistors (output transistors) and an output transistor driving circuit for driving the output transistors in the push-pull circuits 11 and 12. The bi-directional motor M is connected between the output terminals of the push-pull circuits 11 and 12 and is rotated in a forward or reverse direction by outputs of the push-pull circuits 11 and 12. The push-pull circuit 11 is formed of output transistors QN1 and QN2 of NPN type whose current paths are serially connected between a power source Vcc and a ground terminal GND. Likewise, the push-pull circuit 12 is formed of output transistors QN3 and QN4 of NPN type whose current paths are serially connected between the power source Vcc and the ground terminal GND. The output transistor driving circuit is constituted by first and second driving transistors QP1 and QP2 of PNP multi-collector (two-collector) type, first and second control transistors QP3 and QP4 of PNP type for preventing the flow of a through current, and first and second pre-driving transistors QN5 and QN6 of NPN multi-collector (two-collector) type. That is, the emitter of the driving transistor QP1 is connected to the power source Vcc, and the first and second collectors thereof are respectively connected to the bases of the output transistors QN1 and QN4. The emitter of the driving transistor QP2 is connected to the power source Vcc, and the first and second collectors thereof are respectively connected to the bases of the output transistors QN3 and QN2. The emitter of the first control transistor QP3 is connected to the power source Vcc, and the collector thereof is connected to the base of the driving transistor QP1. The emitter of the second control transistor QP4 is connected to the power source Vcc, and the collector thereof is connected to the base of the driving transistor QP2. Further, the emitter of the first pre-driving transistor QN5 is connected to the ground terminal GND, and the first and second collectors thereof are respectively connected to the bases of the driving transistor QP1 and the control transistor QP4. The emitter of the second pre-driving transistor QN6 is connected to the ground terminal GND, and the first and second collectors thereof are respectively connected to the bases of the driving transistor QP2 and the control transistor QP3. The bases of the two pre-driving transistors QN5 and QN6 are connected to receive driving control signals SD1 and SD2 which are in an inverted phase relationship.

Next, the operation of the circuit having the above construction is explained. When the driving control signals SD1 and SD2 are respectively set to high and low levels, the pre-driving transistors QN5 and QN6 are respectively turned on and off and the driving transistors QP1 and QP2 are respectively turned on and off. Therefore, the output transistors QN1 and QN4 are turned on and the output transistors QN2 and QN3 are turned off. As a result, a current flows from the power source Vcc to the ground terminal GND via the collector-emitter path of the output transistor QN1, the motor M, and the collector-emitter path of the output transistor QN4. Therefore, a current flows in the motor M in a direction indicated by an arrow A to rotate the motor M in a forward direction. At this time, since the control transistor QP4 is turned on (the transistor QP3 is turned off) by the turn-on of the pre-driving transistor QN5, the driving transistor QP2 is forcedly turned off.

When the driving control signals SD2 and SD1 are respectively set to high and low levels, the pre-driving transistors QN6 and QN5 are respectively turned on and off and the driving transistors QP2 and QP1 are respectively turned on and off. Therefore, the output transistors QN2 and QN3 are turned on and the output transistors QN1 and QN4 are turned off. As a result, a current flows from the power source Vcc to the ground terminal GND via the collector-emitter path of the output transistor QN3, the motor M, and the collector-emitter path of the output transistor QN2. Therefore, a current flows in the motor M in a direction indicated by an arrow B to rotate the motor M in a reverse direction. At this time, since the control transistor QP3 is turned on (the transistor QP4 is turned off) by the turn-on of the pre-driving transistor QN6, the driving transistor QP1 is forcedly turned off.

Therefore, when the transistor QP3, connected between the emitter and base of one of the driving transistors, for example, the transistor QP1 which is changed from the OFF state to the ON state at the time of changing the polarity of a current supplied to the motor M, is changed from the ON state to the OFF state, the inverting operation of changing the driving transistor QP1 from the OFF state to the ON state is delayed by the time delay caused when the transistor QP3 is changed from the ON state to the OFF state. Therefore, even when the inverting operation of changing the other driving transistor QP2, which is changed from the ON state to the OFF state at the time of changing the polarity of the current from the ON state to the OFF state, is delayed, the output transistors QN1 and QN2 or transistors QN3 and QN4 in the push-pull circuit 11 or 12 can be prevented from being turned on at the same time.

In order to ensure the above operation, the circuit may be designed with much attention paid to the pair property of the dimensions and current amplification factors of the driving transistors QP1 and QP2 and control transistors QP4 and QP3.

According to the motor driving circuit shown in the first embodiment, the time lag occurs at the time of changing the polarity of a current supplied to the load (motor M) and the output transistors QN1 and QN2 of the push-pull circuit 11 or the output transistors QN3 and QN4 of the push-pull circuit 12 can be prevented from being turned on at the same time, so that the flow of a through current can be prevented and the output transistors QN1 to QN4 can be prevented from being deteriorated or damaged. Further, in order to prevent the flow of a through current, only two control transistors QP3 and QP4 are basically required and the number of elements used is small so that a significant increase in the chip size at the time of integration can be prevented. Further, since the transistors can be formed on the same chip, externally attached parts are not required.

FIG. 3 shows a motor driving circuit as a load driving circuit according to a second embodiment of this invention. A first push-pull circuit 21 includes an output transistor QP5 of PNP type and an output transistor QN2 of NPN type whose current paths are serially connected between a power source Vcc and a ground terminal GND. Likewise, a second push-pull circuit 22 includes an output transistor QP6 of PNP type and an output transistor QN4 of NPN type whose current paths are serially connected between the power source Vcc and the ground terminal GND. An output transistor driving circuit is constituted by first and second driving transistors QN7 and QN8 of NPN multi-collector type, and first and second control transistors QP3 and QP4 of PNP type for preventing the flow of a through current. The emitter of the driving transistor QN7 is connected to the base of the output transistor QN4 and the first collector thereof is connected to the base of the output transistor QP5. The emitter of the second driving transistor QN8 is connected to the output transistor QN2 and the first collector thereof is connected to the base of the output transistor QP6. The bases of the first and second driving transistors QN7 and QN8 are connected to receive driving control signals SD1 and SD2 which are in an inverted phase relationship. The emitter of the first control transistor QP3 is connected to the power source Vcc, the collector thereof is connected to the base of the output transistor QP5, and the base thereof is connected to the second collector of the driving transistor QN8 and is driven in phase with the output transistor QP6. The emitter of the second control transistor QP4 is connected to the power source Vcc, the collector thereof is connected to the base of the output transistor QP6 and the base thereof is connected to the second collector of the driving transistor QN7 and is driven in phase with the output transistor QP5.

In the motor driving circuit of FIG. 3, the control transistor QP4 is turned on by the driving transistor QN7 when the output transistors QP5 and QN4 are set into the ON state by the driving transistor QN7. As a result, the output transistor QP6 of the push-pull circuit 22 is forcedly set into the OFF state. On the other hand, the control transistor QP3 is turned on by the driving transistor QN8 when the output transistors QP6 and QN2 are set into the ON state by the driving transistor QN8. As a result, the output transistor QP5 of the push-pull circuit 21 is forcedly set into the OFF state.

Therefore, when the control transistor QP3 connected between the emitter and base of one of the output transistors, for example, the transistor QP5 which is changed from the OFF state to the ON state at the time of changing the polarity of a current supplied to the load (motor M) is controlled so as to be changed from the ON state to the OFF state, the inverting operation of changing the output transistor QP5 from the OFF state to the ON state is delayed by the time delay caused when the control transistor QP3 is changed from the ON state to the OFF state. Therefore, even when the inverting operation of changing the other driving transistor QP6, which is changed from the ON state to the OFF state at the time of changing the polarity of the current from the ON state to the OFF state, is delayed, the output transistors QP5 and QN2 or output transistors QP6 and QN4 in the push-pull circuit 11 or 12 can be prevented from being set in the ON state at the same time.

Therefore, substantially the same effect as that of the first embodiment can be obtained by the motor driving circuit shown in FIG. 3.

Figure 4:
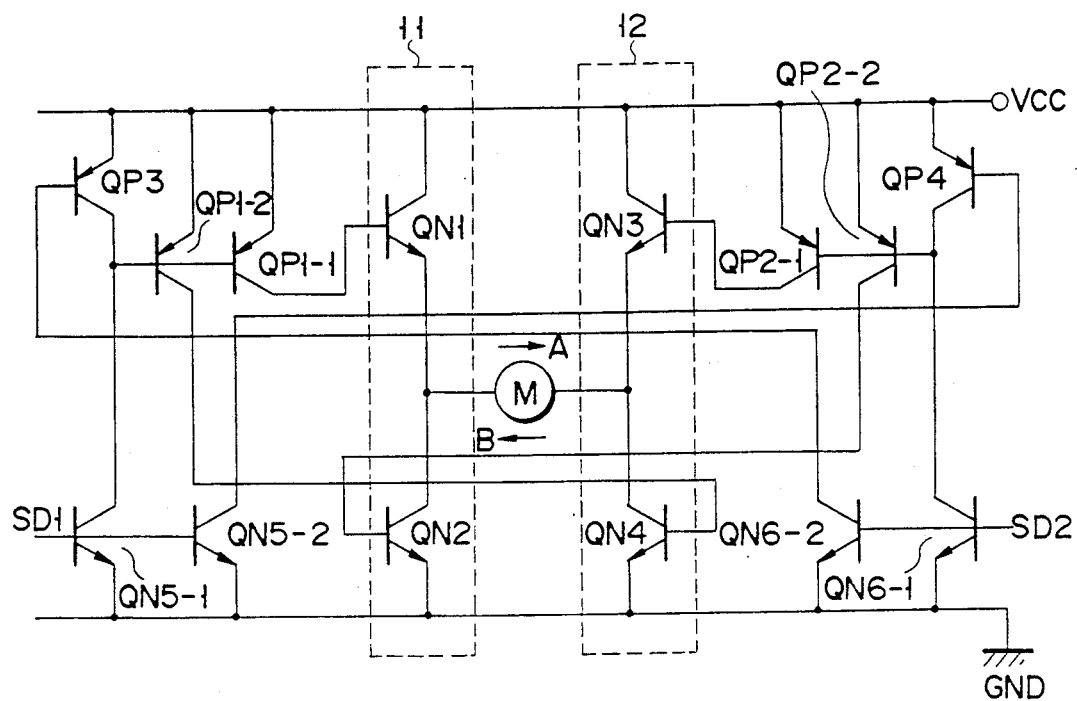
FIG. 4 is a circuit diagram showing a load driving circuit according to a third embodiment of this invention.

In the first embodiment shown in FIG. 2, the driving transistor QP1 and QP2, and the pre-driving transistors QN5 and QN6 are multi-collector transistors. Each of these transistors can be replaced by two single-collector transistors as is illustrated in FIG. 4. More specifically, the transistor QP1 can be replaced by transistors QP1-1 and QP1-2; the transistor QP2 can be replaced by transistors QP2-1 and QP2-2; the transistor QN5 is replaced by transistors QN5-1 and QN5-2; and the transistor QN6 is replaced by transistors QN6-1 and QN6-2. The circuit of in FIG. 4 achieves the same advantage as the circuit shown in FIG. 2.

Figure 5:
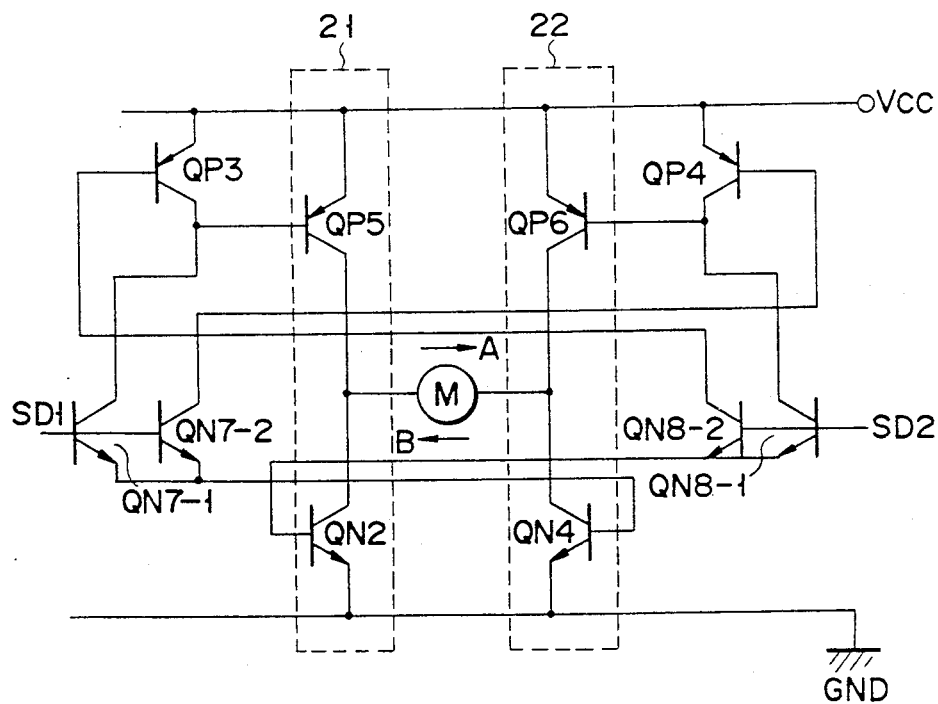
FIG. 5 is a circuit diagram showing a load driving circuit according to a fourth embodiment of this invention.

In the second embodiment shown in FIG. 3, the driving transistors QN7 and QN8 are multi-collector transistors. Each of these driving transistors can be replaced by two signal-collector transistors. More specifically, as is shown in FIG. 5, the transistor QN7 can be replaced by transistors QN7-1 and QN7-2, and the transistors QN8 can be replaced by transistors QN8-1 and QN8-2. The circuit of FIG. 5 accomplishes the same advantage as the circuit shown in FIG. 3.

In the first to fourth embodiments, an example of the motor driving circuit for driving the bi-directional motor as a load is explained. However, the load is not limited to the bi-directional motor and the circuit can be designed to drive another load such as a plunger.

What is claimed is:

1. A load driving circuit comprising:
   a first push-pull circuit, having an output terminal connected to a first end of a load and having first and second output transistors of NPN type each having an emitter, a base, and a collector, with current paths serially connected between a power source and a ground terminal;
   a second push-pull circuit, having an output terminal connected to a second end of said load and having third and fourth output transistors of NPN type each having an emitter, a base, and a collector, with current paths serially connected between said power source and said ground terminal;
   a first driving transistor of multi-collector PNP type, having an emitter, a base, a first and second collectors, the emitter connected to said power source, the first collector connected to the base of said first output transistor, and the second collector connected to the base of said fourth output transistor;
   a second driving transistor of multi-collector PNP type, having an emitter, a base, and first and second collectors, the emitter connected to said power source, the first collector connected to the base of said third output transistor, and the second collector connected to the base of said second output transistor, the second driving transistor being driven in an inverted phase with respect to said first driving transistor;
   a first control transistor of PNP type, having an emitter, a base, and a collector, the emitter connected to said power source and the collector connected to the base of said first driving transistor, the first control transistor being driven in the same phase as said second driving transistor; and
   a second control transistor of PNP type, having an emitter, a base, and a collector, the emitter connected to said power source and the collector connected to the base of said second driving transistor, the second control transistor being driven in the same phase as said first driving transistor.

2. A load driving circuit according to claim 1, further comprising:
   a first pre-driving transistor of multi-collector NPN type, having an emitter, a base, and first and second collectors, the emitter connected to said ground terminal, the first collector connected to the base of said first driving transistor, the second collector connected to the base of said second control transistor, and the base connected to receive a first driving control signal; and
   a second pre-driving transistor of multi-collector NPN type, having an emitter, a base, and first and second collectors, the emitter connected to said ground terminal, the first collector connected to the base of said second driving transistor, the second collector connected to the base of said first control transistor, and the base connected to receive a second driving control signal.

3. A load driving circuit according to claim 1, wherein said load includes a bi-directional motor.

4. A load driving circuit comprising:
   a first push-pull circuit, having an output terminal connected to a first end of a load and having a first output transistor of PNP type and a second output transistor of NPN type with current paths serially connected between a power source and a ground terminal;
   a second push-pull circuit, having an output terminal connected to a second end of said load and having a third output transistor of PNP type and a fourth output transistor of NPN type with current paths serially connected between said power source and said ground terminal;
   a first driving transistor of multi-collector NPN type, having an emitter, a base and first and second collectors, the first collector connected to the base of said first output transistor, the second collector connected to the base of a second control transistor, the emitter connected to the base of said third output transistor, and the base connected to receive a first driving control signal;
   a second driving transistor of multi-collector NPN type, having an emitter, a base and first and second collectors, said first collector connected to the base of said fourth output transistor, the second collector connected to the base of a first control transistor, the emitter connected to the base of said second output transistor, and the base connected to receive a second driving control signal which is in an inverted relation with respect to said first driving control signal, the second driving transistor being driven in an inverted phase with respect to said first driving transistor;
   wherein the first control transistor being PNP type, has an emitter, a base, and a collector, the emitter connected to said power source and the collector connected to the base of said first output transistor, the first control transistor being driven in the same phase as said third output transistor; and wherein the second control transistor being PNP type, has an emitter, a base, and a collector, the emitter connected to said power source and the collector connected to the base of said fourth output transistor, the second control transistor being driven in the same phase as said first output transistor.

5. A load driving circuit according to claim 4, wherein said load includes a bi-directional motor.

6. A load driving circuit comprising:
a first push-pull circuit, having an output terminal connected to a first end of a load and having first and second output transistors of NPN type with current paths serially connected between a power source and a ground terminal;
a second push-pull circuit, having an output terminal connected to a second end of said load and having third and fourth output transistors of NPN type with current paths serially connected between said power source and said ground terminal;
a first driving transistor of PNP type, having an emitter, a base, and a collector, the emitter connected to said power source, and the collector connected to the base of said first output transistor;
a second driving transistor of PNP type, having an emitter, a base, and a collector, the emitter connected to said power source, and the collector connected to the base of said fourth output transistor;
a third driving transistor of PNP type, having an emitter, a base, and a collector, the emitter connected to said power source, and the collector connected to the base of said third output transistor, said third driving transistor being driven in an inverted phase with respect to said first and second driving transistor;
a fourth driving transistor of PNP type, having an emitter, a base, and a collector, the emitter connected to said power source, and the collector connected to the base of said second output transistor, the fourth driving transistor being driven in an inverted phase with respect to said first and second driving transistors;
a first control transistor of PNP type, having an emitter, a base, and a collector, the emitter connected to said power source and the collector connected to the bases of said first and second driving transistors, the first control transistor being driven in the same phase as said third and fourth driving transistors; and
a second control transistor of PNP type, having an emitter, a base, and a collector, the emitter connected to said power source and the collector connected to the bases of said third and fourth driving transistors, the second control transistor being driven in the same phase as said first and second driving transistors.

7. A load driving circuit according to claim 6, further comprising:
a first pre-driving transistor of NPN type, having an emitter, a base, and a collector, the emitter connected to said ground terminal, the collector connected to the bases of said first and second driving transistors, and the base connected to receive a first driving control signal;
a second pre-driving transistor of NPN type, having an emitter, a base, and a collector, the emitter connected to said ground terminal, a collector connected to the bases of said second control transistor, and the base connected to receive the first driving control signal;
a third pre-driving transistor of NPN type, having an emitter, a base, and a collector, the emitter connected to said ground terminal, the collector connected to the bases of said third and fourth control transistors and the base connected to receive a second driving control signal which is in an inverted relation with respect to said first driving control signal; and
a fourth pre-driving transistor of NPN type, having an emitter, a base, and a collector, the emitter connected to said ground terminal, the collector connected to the base of said first control transistor, and the base connected to receive the second driving control signal.

8. A load driving circuit according to claim 6, wherein said load includes a bi-directional motor.

9. A load driving circuit comprising:
a first push-pull circuit, having an output terminal connected to a fist end of a load and having a first output transistor of PNP type and a second output transistor of NPN type with current paths serially connected between a power source and a ground terminal;
a second push-pull circuit, having an output terminal connected to a second end of said load and having a third output transistor of PNP type and a fourth output transistor of NPN type with current paths serially connected between said power source and said ground terminal;
a first driving transistor of NPN type, having an emitter, a base, and a collector, the collector connected to the base of said first output transistor and the emitter connected to the base of said fourth output transistor;
a second driving transistor of NPN type, having an emitter, a base and a collector, the collector connected to the base of said third output transistor and the emitter connected to the base of said second output transistor, the second driving transistor being driven in an inverted phase with respect to said first driving transistor;
a third driving transistor of NPN type, having an emitter, a base, and a collector, the collector connected to the base of a second control transistor, the emitter connected to the base of said fourth output transistor, and the base connected to the base of said first driving transistor; and
a fourth driving transistor of NPN type, having an emitter, a base, and a collector, the collector connected to the base of a first control transistor, the emitter connected to the base of said second output transistor, the base connected to the base of said second driving transistor;
wherein said first control transistor being PNP type, has an emitter, a base, and a collector, the emitter connected to said power source and the collector connected to the base of said first output transistor, the first control transistor being driven in the same phase as said third output transistor; and
wherein said second control transistor being PNP type, has an emitter, a base, and a collector, the emitter connected to said power source and the collector connected to the base of said third output transistor, the second control transistor being driven in the same phase as said first output transistor.

10. A load circuit according to claim 9, wherein said load includes a bi-directional motor.

* * * * *

UNITED STATES PATENT AND TRADEMARK OFFICE
CERTIFICATE OF CORRECTION

PATENT NO. : 5,132,600
DATED : July 21, 1992
INVENTOR(S) : Hitoshi Kinoshita It is certified that error appears in the above-identified patent and that said Letters Patent is hereby corrected as shown below:

Claim 1, column 7, line 52, change "a" (second occurence) to --and--.

Abstract, line 25, change "is" to --are--.

Signed and Sealed this

Sixteenth Day of November, 1993

*Attest:*

BRUCE LEHMAN

*Attesting Officer*    *Commissioner of Patents and Trademarks*